(12) United States Patent
Shigeta et al.

(10) Patent No.: US 8,698,977 B2
(45) Date of Patent: Apr. 15, 2014

(54) LIGHTING DEVICE AND DISPLAY DEVICE

(75) Inventors: Hiroaki Shigeta, Osaka (JP); Naru Usukura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 177 days.

(21) Appl. No.: 13/264,497

(22) PCT Filed: Dec. 8, 2009

(86) PCT No.: PCT/JP2009/070561
§ 371 (c)(1),
(2), (4) Date: Oct. 14, 2011

(87) PCT Pub. No.: WO2010/119590
PCT Pub. Date: Oct. 21, 2010

(65) Prior Publication Data
US 2012/0044441 A1   Feb. 23, 2012

(30) Foreign Application Priority Data
Apr. 17, 2009 (JP) .................... 2009-101302

(51) Int. Cl.
*G02F 1/1335* (2006.01)
(52) U.S. Cl.
USPC ............... 349/65; 349/61; 349/62; 349/63; 349/64; 349/67
(58) Field of Classification Search
USPC .......... 349/61, 62, 63, 64, 65, 67, 68, 70
See application file for complete search history.

(56) References Cited

U.S. PATENT DOCUMENTS

| | | | | |
|---|---|---|---|---|
| 6,992,718 | B1 * | 1/2006 | Takahara | ............. 348/333.09 |
| 7,265,341 | B2 * | 9/2007 | Mizutani | .................. 250/239 |
| 2008/0165307 | A1 | 7/2008 | Adachi et al. | |
| 2009/0046444 | A1 | 2/2009 | Nakamura et al. | |
| 2009/0129058 | A1 | 5/2009 | Tokita et al. | |

FOREIGN PATENT DOCUMENTS

| | | |
|---|---|---|
| JP | 3025052 U | 6/1996 |
| JP | 2004-235139 A | 8/2004 |
| JP | 2007-53014 A | 3/2007 |
| JP | 2007-123131 A | 5/2007 |
| JP | 2007-287384 A | 11/2007 |
| JP | 2007-287678 A | 11/2007 |
| JP | 2008-171590 A | 7/2008 |
| WO | 2006/129409 A1 | 12/2006 |

* cited by examiner

*Primary Examiner* — Jennifer Doan
(74) *Attorney, Agent, or Firm* — Chen Yoshimura LLP

(57) ABSTRACT

Provided is a lighting device (3) that includes a light guide plate (10) having a light entry surface (10a) through which the light originating from a light-emitting diode unit (9) enters, and a light-emitting surface (10c) from which the light that has entered through the light entry surface (10a) exits. The light-emitting diode unit (9) has light-emitting elements (26a and 27a) arranged linearly on a base member (28) with a prescribed interval therebetween, and sealing resin elements (26b and 27b) that seal respective light-emitting elements (26a and 27a). The light entry surface (10a) of the light guide plate (10) is shaped so as to engage with the sealing resin elements (26b and 27b).

19 Claims, 11 Drawing Sheets

LIGHTING DEVICE AND DISPLAY DEVICE

TECHNICAL FIELD

The present invention relates to a lighting device. More particularly, the present invention relates to a lighting device equipped with a light guide plate, and to a display device using such a lighting device.

BACKGROUND ART

In recent years, liquid crystal display devices, for example, which are thinner and lighter than conventional cathode-ray tubes, are in wide use as flat panel displays for liquid crystal television monitors, portable phones, and the like. These liquid crystal display devices include a lighting device that emits light (backlight device), and a liquid crystal panel that functions as a camera shutter against the light originated from the light source in the lighting device to display desired images.

The lighting devices are broadly classified into a direct type and an edge light type, depending on the arrangement of the light source relative to the liquid crystal panel. For example, in the liquid crystal display device for use in portable phones, notebook PCs, or PDAs, the edge light type lighting device, which can be made thinner more easily than the direct type lighting device, are generally used. That is, in the edge light-type lighting device, the light sources are disposed along the sides of the liquid crystal panel, and therefore, the lighting device can have a thin structure. Also, the light originated from the light source is guided towards the liquid crystal panel though a light guide plate having a light-emitting surface facing the liquid crystal panel.

One of the conventional lighting devices disclosed, the one described in Patent Document 1 below, for example, uses light-emitting diodes (LED) as the light source. In this conventional lighting device, a plurality of light-emitting elements (LED chips) of light-emitting diodes are disposed along the longitudinal direction of a long and thin square bar-shaped printed substrate. Further, in this conventional lighting device, reflecting plates are disposed on both sides of each of the light-emitting elements such that the reflecting plate and the light-emitting element are arranged alternately. This way, a high-luminance linear light beam with little luminance variation can enter the light guide plate.

RELATED ART DOCUMENTS

Patent Documents

Patent Document 1: Japanese Patent Application Laid-Open Publication No. 2004-235139

SUMMARY OF THE INVENTION

Problems to be Solved by the Invention

However, in the conventional lighting device described above, because the light-emitting elements and the reflecting plates are arranged alternately, the number of the light-emitting elements that can be disposed on the printed substrate is limited, and therefore it was difficult to dispose an increased number of the light-emitting elements. As a result, in this conventional lighting device, it was difficult to improve the light use efficiency and to dispose an increased number of the light-emitting elements at the same time, and it was also difficult to obtain a higher-luminance lighting device.

In consideration of the issues described above, the present invention is aiming at providing a high-luminance lighting device which allows installation of an increased number of light-emitting elements and is capable of improving the light use efficiency, and also providing a display device that uses such a lighting device.

Means for Solving the Problems

In order to achieve the objectives stated above, a lighting device of the present invention includes a light-emitting diode unit having a plurality of light-emitting diodes, and a light guide plate having a light entry surface through which light originated from the light-emitting diode unit enters, and a light-emitting surface from which the light that has entered through the light entry surface is projected, the light guide plate further guiding the light that has entered through the light entry surface to prescribed propagation directions so that the light is projected from the light-emitting surface, the light-emitting diode unit including a base member, a plurality of light-emitting elements arranged linearly on the base member with a prescribed interval therebetween, and sealing resin elements formed into a prescribed shape and are provided for the respective light-emitting elements to seal the corresponding light-emitting elements on the base member, wherein the light entry surface is shaped on the light guide plate such that the light entry surface engages with the plurality of sealing resin elements, which are respectively provided for the light-emitting elements.

The light-emitting diode unit of the lighting device, which is configured as described above, has a plurality of light-emitting elements arranged linearly on the base member with the prescribed interval therebetween, and sealing resin elements that are formed into a prescribed shape and are provided for the respective light-emitting elements to seal the corresponding light-emitting elements on the base member. Also, on the light guide plate, a light entry surface is formed to be fitted to the plurality of sealing resin elements provided for the respective light-emitting elements. This way, unlike the aforementioned conventional configuration, a high luminance lighting device which allows installation of an increased number of light-emitting elements and is capable of improving the light use efficiency can be provided.

Regarding the aforementioned lighting device, in the light-emitting diode unit, the plurality of sealing resin elements may be formed into a half-circular column shape on the base member, and the light entry surface of the light guide plate may include a half-circular columnar-shaped recessed portions which are formed to touch the top portions of the half-circular columnar sealing resin elements, and to be fitted to the half-circular columnar sealing resin elements.

In this case, the light-emitting diode unit and the light guide plate are coupled together with the sealing resin elements and the half-circular columnar recessed portions of the light entry surface fitted to each other. This configuration reliably improves the light use efficiency of the light-emitting diode unit in which the light enters through the light entry surface.

Also, regarding the aforementioned lighting device, in the light-emitting diode unit, each of the plurality of sealing resin elements may be formed into a half-circular column shape on the base member, and the light entry surface of the light guide plate may have flat surfaces that touch the top portions of the half-circular columnar sealing resin elements, and also may have approximately half-circular columnar recessed portions formed to be fitted to the half-circular columnar sealing resin elements.

In this case, with the sealing resin elements and the approximately half-circular columnar recessed portions of the light entry surface fitted together, the light-emitting diode unit and the light guide plate are coupled with each other. This configuration reliably improves the light use efficiency of the light-emitting diode unit in which the light enters through the light entry surface.

Also, regarding the aforementioned lighting device, in the light-emitting diode unit, each of the plurality of sealing resin elements may be formed into a hemispherical shape on the base member, and the light entry surface of the light guide plate may have hemispherical recessed portions formed to touch the top portions of the hemispherical sealing resin elements and to be fitted to the hemispherical sealing resin elements.

In this case, with the sealing resin elements and the hemispherical recessed portions of the light entry surface fitted together, the light-emitting diode unit and the light guide plate are coupled with each other. This configuration can reliably improve the light use efficiency of the light-emitting diode unit in which the light enters through the light entry surface.

Also, regarding the aforementioned lighting device, in the light-emitting diode unit, a first light-emitting diode section, which can emit white light, and the second light-emitting diode section, which can emit infrared light, may be arranged alternately on the base member.

In this case, the white light and infrared light can appropriately be projected from the light-emitting surface, and a uniform luminance distribution of the white light and infrared light can easily be obtained.

Also, regarding the aforementioned lighting device, the first light-emitting diode section preferably includes a blue light-emitting element, which serves as the light-emitting element emitting the blue light, and a fluorescent resin, which serves as the sealing resin element provided on the base member to seal the blue light-emitting element, and converts a part of the blue light into yellow light and mixes the blue light and the yellow light to produce white light, and the second light-emitting diode section preferably includes an infrared light-emitting element, which is the aforementioned light-emitting element and emits the infrared light, and a transparent resin element, which serves as the sealing resin element provided on the base member to seal the infrared light-emitting element.

In this case, the white light can be obtained from the blue light-emitting element and the fluorescent resin element, and the infrared light can be obtained from the infrared light-emitting element. Also, because neither the first nor the second light-emitting diode section is packaged, a large number of light-emitting diodes can be installed in a limited space, and therefore the light-emitting diode unit and the lighting device can be made small. As a result, the lighting device can easily be made thinner.

Also, regarding the aforementioned lighting device, for the light-emitting surface of the light guide plate, an effective light-emitting area, which effectively projects the light from the light-emitting diode unit, is defined.

In the light-emitting diode unit, when the shortest distance from the contact point between the fluorescent resin element and the light entry surface to the effective light-emitting area is "L", the distance "P2", which is the interval between the two neighboring blue light-emitting elements, is preferably set based on L/P2.

In this case, uneven luminance of white light (hot spots) in the effective light-emitting area can be prevented from occurring.

The display device of the present invention is characterized in that it includes a display section having a plurality of pixels and an illuminating section that illuminates the display section, and that one of the lighting devices described above is used in the illuminating section.

In the display device configured as described above, because a high-luminance lighting device that allows the installation of increased number of light-emitting elements and is able to improve the light use efficiency is used in the illuminating section, a high-performance display device that can display information with a high luminance can easily be configured.

Also, regarding the aforementioned display device, a touch panel including optical sensors, which are disposed on a pixel-by-pixel basis and are capable of detecting infrared light, is preferably provided in the display section.

In this case, a display device including a touch panel is configured. Such a display device can detect operational input instructions by a user. Also, because optical sensors that are disposed on a pixel-by-pixel basis and detect infrared light are included in the touch panel, the detection precision of the touch panel can be improved regardless of the contents of the display in the display section.

In the above-mentioned display device, preferably a liquid crystal panel is used in the display section, and the optical sensors are unitarily disposed on the active matrix substrate of the liquid crystal panel.

In this case, a display device equipped with a compact touch panel can easily be configured.

Effects of the Invention

According to the present invention, a high-luminance lighting device that allows installation of an increased number of light-emitting elements and that is able to improve the light use efficiency, and a display device using such a lighting device can be provided.

DETAILED DESCRIPTION OF EMBODIMENTS

Below, preferred embodiments of a lighting device and a display device of the present invention are described with reference to figures. In the description below, it is assumed that the present invention is applied to a transmissive liquid crystal display device. Dimensions of the constituting members in the figures do not accurately represent the actual dimensions or dimensional ratios of the constituting members.

Embodiment 1

Figure 1:
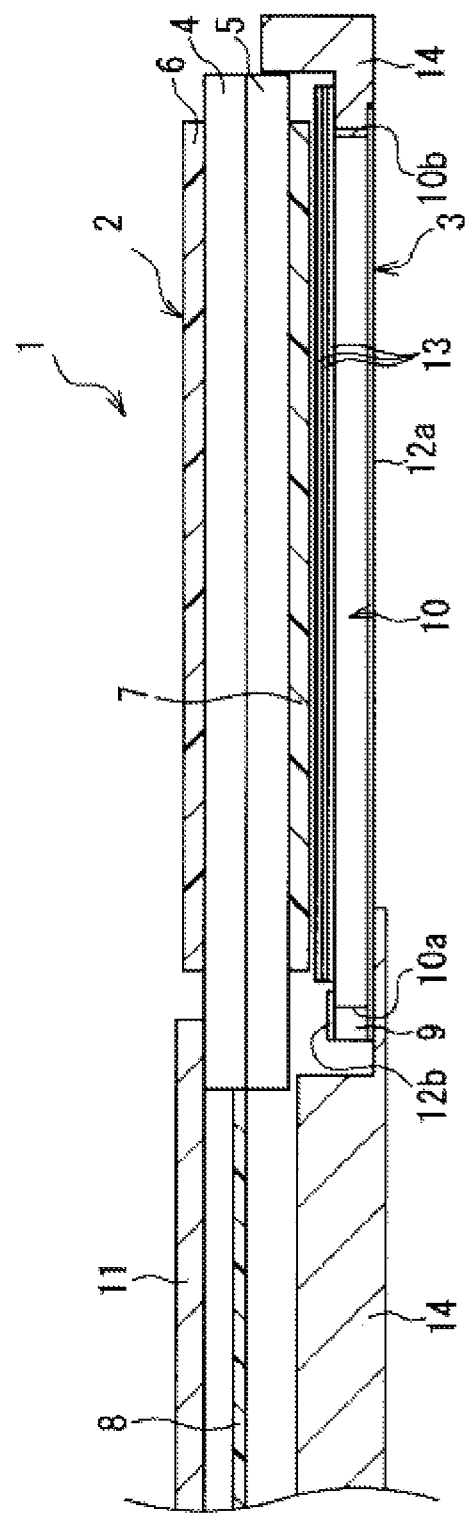
FIG. 1 is a schematic cross-sectional view illustrating a liquid crystal display device according to Embodiment 1 of the present invention.

FIG. 1 is a schematic cross-sectional view illustrating a liquid crystal display device according to Embodiment 1 of the present invention. In FIG. 1, a liquid crystal display device 1 of the present embodiment has a liquid crystal panel 2, which is the display section with the viewer's side (display surface side) shown towards the top of FIG. 1, and a lighting device 3, which is disposed on the non-display surface side of the liquid crystal panel 2 (shown towards the bottom of FIG. 1) and serves as the illuminating section that projects illumination light on the liquid crystal panel 2. Also, this liquid crystal display device 1 unitarily includes a touch panel equipped with optical sensors, which are discussed later, and the liquid crystal display device 1 is also configured to be able to perform prescribed touch panel functions such as detection of operational input instructions by a user via the touch panel.

The liquid crystal panel 2 includes a color filter substrate 4 and an active matrix substrate 5, which constitute a pair of substrates, and polarizing plates 6 and 7 respectively disposed on the outer surfaces of the color filter substrate 4 and the active matrix substrate 5. A liquid crystal layer, which is discussed later, is held between the color filter substrate 4 and the active matrix substrate 5. The polarizing plates 6 and 7 are respectively bonded to the color filter substrate 4 and the active matrix substrate 5 to cover at least the effective display region of the display surface provided on the liquid crystal panel 2.

The active matrix substrate 5 constitutes one of the above-mentioned pair of substrates. On the active matrix substrate 5, for the plurality of pixels included on the display surface of the liquid crystal panel 2, components such as pixel electrodes and thin film transistors (TFT) are formed on the side facing the liquid crystal layer (described in detail below). On the other hand, the color filter substrate 4 constitutes the other of the above-mentioned pair of substrates. On the color filter substrate 4, color filters, an opposite electrode, and the like, which are described below, are formed on the side facing the liquid crystal layer.

Also, the liquid crystal panel 2 includes a FPC (Flexible Printed Circuit) 8, which is connected to a control device (not shown) that controls the driving of the liquid crystal panel 2. The FPC 8 drives the liquid crystal layer on a pixel-by-pixel basis to display desired images on the display surface.

The lighting device 3 includes a linear light-emitting diode unit 9 and a light guide plate 10 disposed facing the linear light-emitting diode unit 9. The linear light-emitting diode unit 9 constitutes a light-emitting diode unit having a plurality of light-emitting diodes. The linear light-emitting diode unit 9 includes, as described below, a white light-emitting diode (first light-emitting diode section), which emits white light, and an infrared light-emitting diode (second light-emitting diode section), which emits infrared light. The white light, which is used to display information, and the infrared light, which is detected by the optical sensor used for the touch panel functions, are projected on the liquid crystal panel 2 through the light guide plate 10.

In the lighting device 3, the linear light-emitting diode unit 9 and the light guide plate 10 are held by a bezel 14 having an L-shaped cross section, while the liquid crystal panel 2 is disposed above the light guide plate 10. The color filter substrate 4 has a case 11 placed on it. As a result, the lighting device 3 is coupled with the liquid crystal panel 2, and the illumination light from the lighting device 3 is projected to the liquid crystal panel 2. This configuration provides a transmissive liquid crystal display device 1 in which the lighting device 3 and the liquid crystal panel 2 are unified.

For the light guide plate 10, a synthetic resin such as a transparent polycarbonate resin is used. Light from the linear light-emitting diode unit 9 enters the light guide plate 10. Specifically, as shown in FIG. 1, a light guide plate 10 having square cross section is used, and the light guide plate 10 has a light entry surface 10a through which the light from the linear light-emitting diode unit 9 enters, and an opposite surface 10b that faces the light entry surface 10a. Also, the light entry surface 10a of the light guide plate 10 is unitarily coupled with the linear light-emitting diode unit 9, and is configured so that the light from the linear light-emitting diode unit 9 enters efficiently into the light guide plate 10 (to be described in detail below).

Also, the light guide plate 10 has a reflective sheet 12a on the side away from the liquid crystal panel 2. The reflective sheet 12a is disposed under the linear light-emitting diode unit 9, and, together with the reflective sheet 12b disposed over the linear light-emitting diode unit 9, the reflective sheet 12a is configured so that the light from the linear light-emitting diode unit 9 enters into the light guide plate 10 efficiently. Further, on the light guide plate 10, optical sheets 13 including a lens sheet and a diffusion sheet are provided on the side facing the liquid crystal panel 2. Through the optical sheets 13, the light emitted from the light guide plate 10 is redirected to the front, converted to a flat illumination light having a desired visual characteristics and a uniform intensity over the light-emitting surface, and then sent to the liquid crystal panel 2.

Next, individual sections of the liquid crystal display device 1 of the present embodiment are described in detail with reference to FIG. 2 to FIG. 9.

Figure 2:
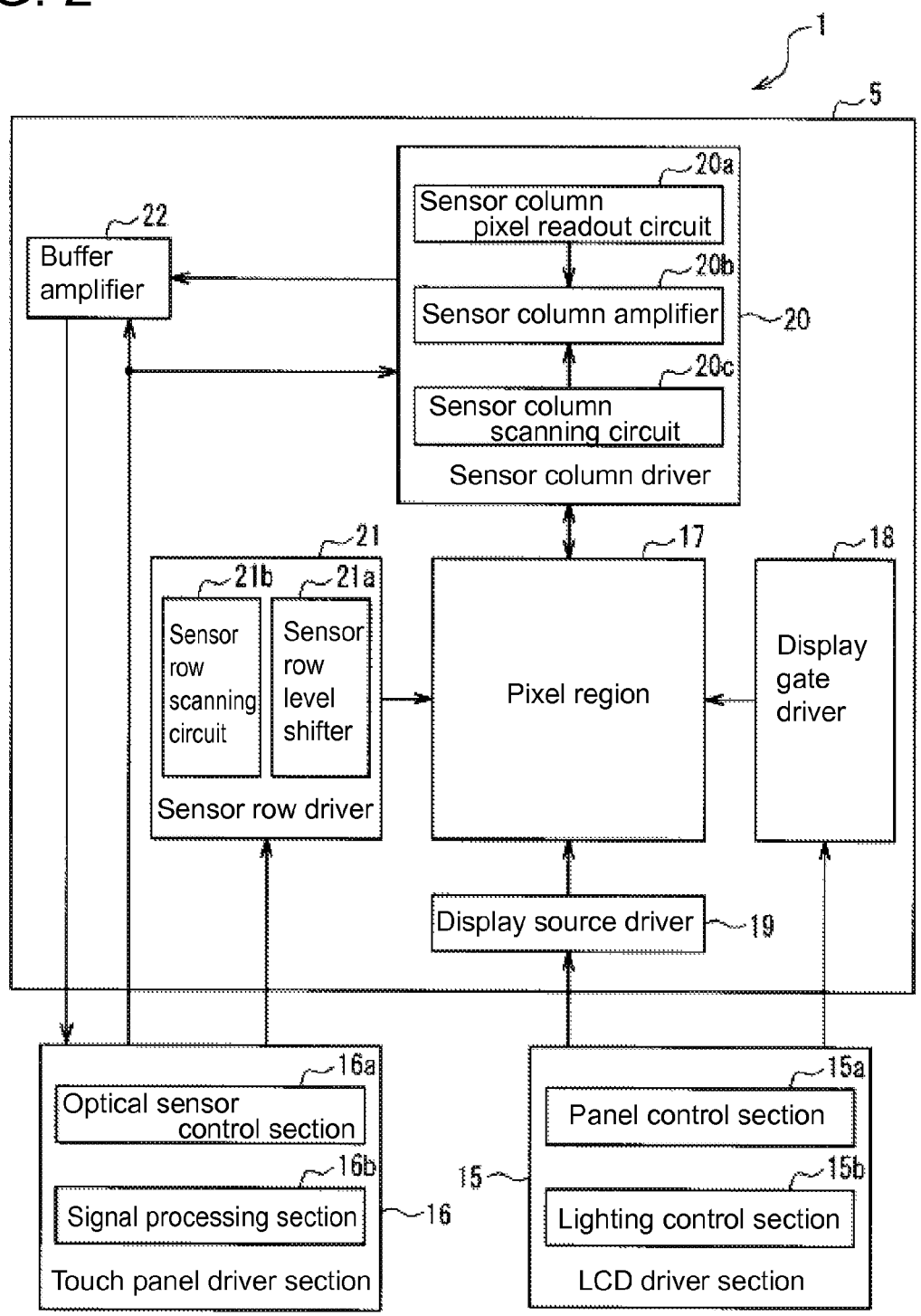
FIG. 2 illustrates a configuration of main components of the liquid crystal display device.
Figure 3:
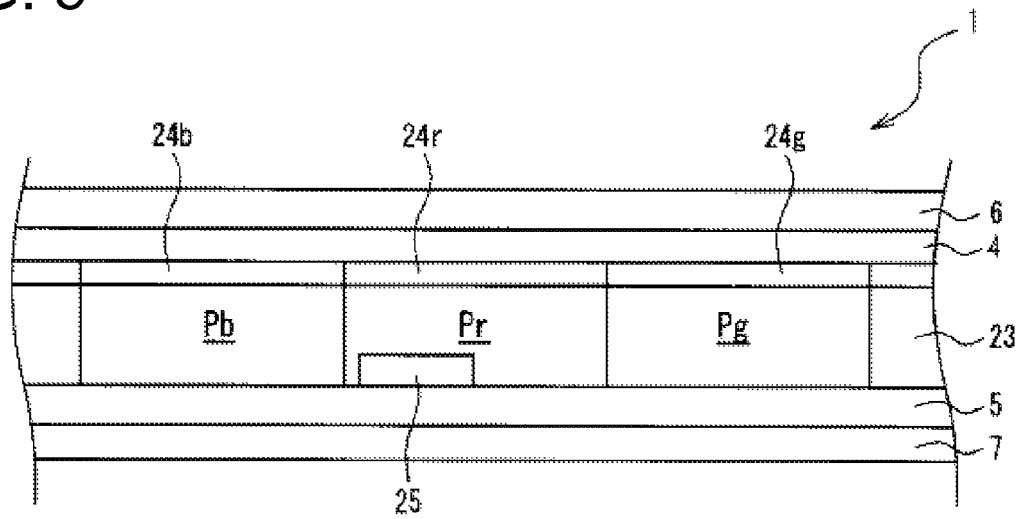
FIG. 3 is an enlarged cross-sectional view specifically illustrating a pixel configuration of the liquid crystal display device.
Figure 4:
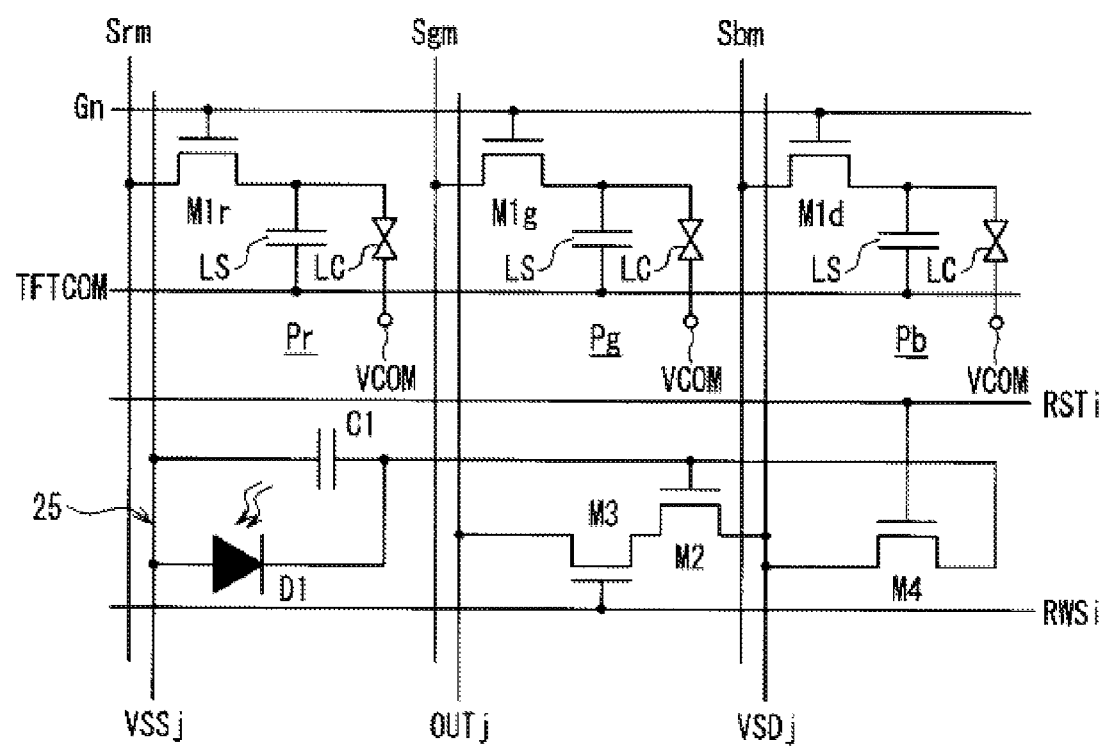
FIG. 4 is an equivalent circuit diagram showing the configuration of the pixels and the optical sensors disposed on the liquid crystal display device.
Figure 5:
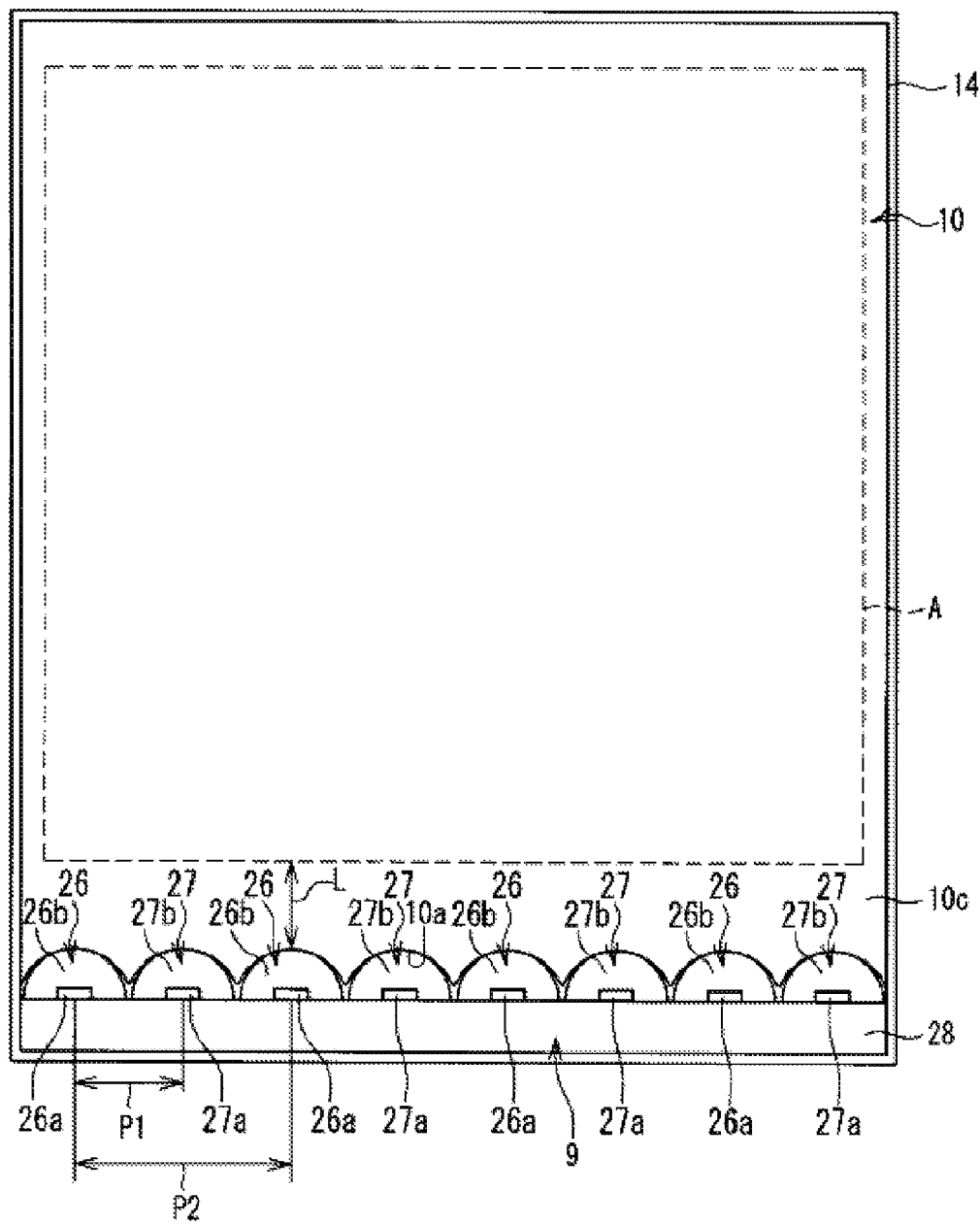
FIG. 5 is a plan view showing the light guide plate and the linear light-emitting diode unit shown in FIG. 1.
Figure 6:
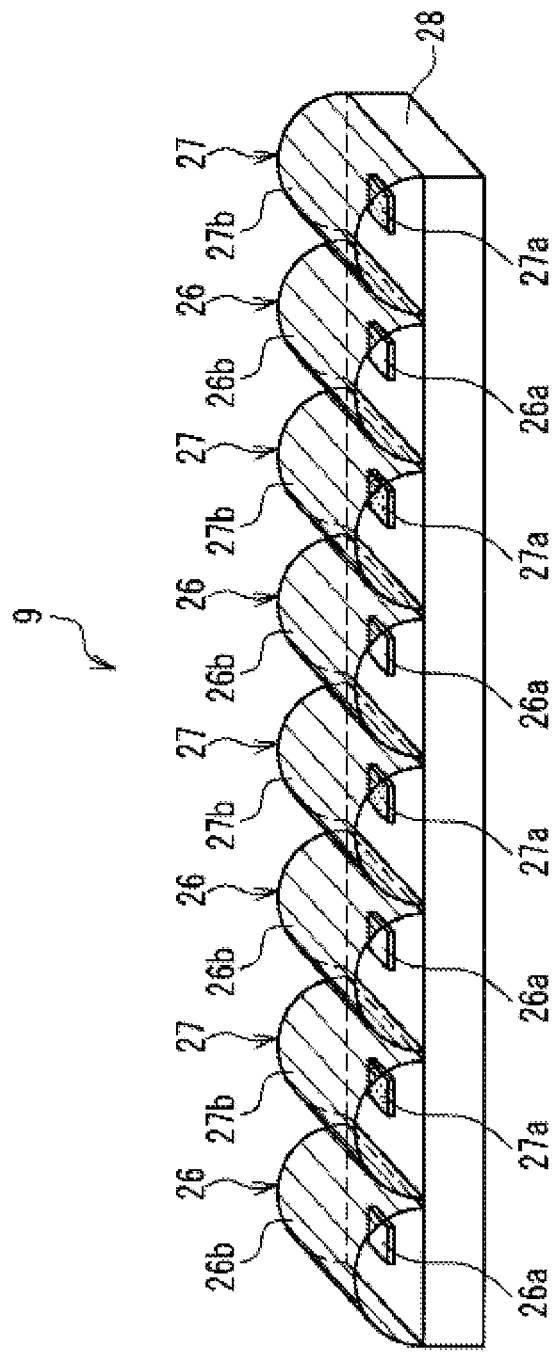
FIG. 6 is a perspective view specifically illustrating a configuration of the linear light-emitting diode unit.
Figure 7:
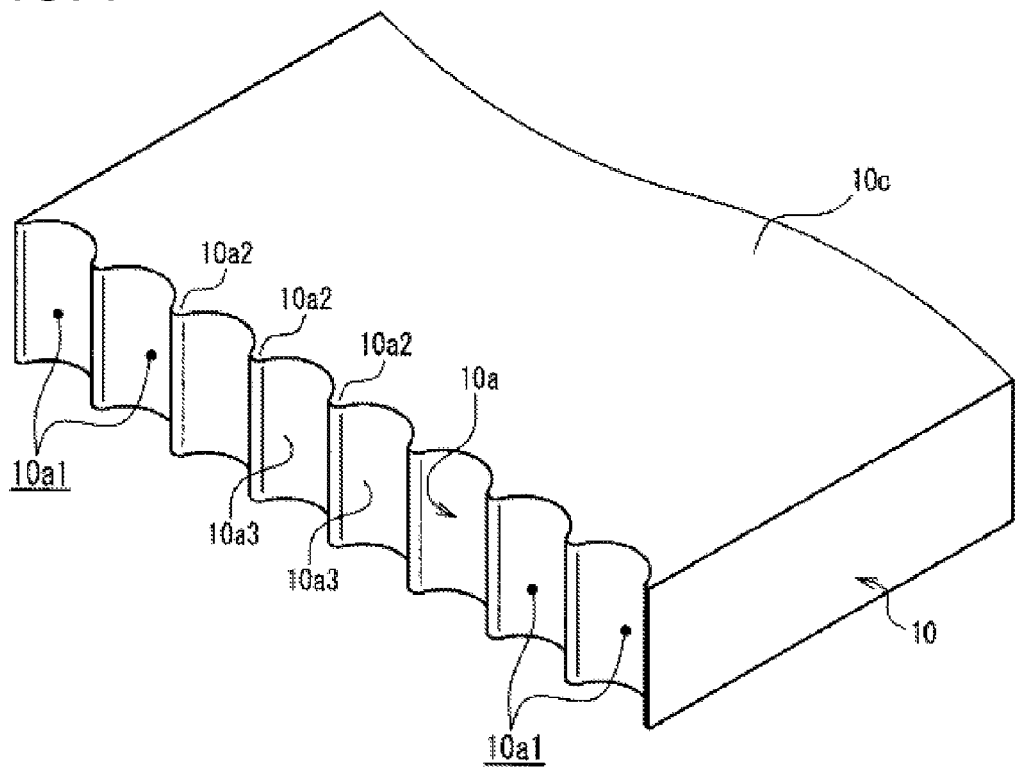
FIG. 7 is a perspective view specifically illustrating a configuration of the main portion of the light guide plate.
Figure 8:
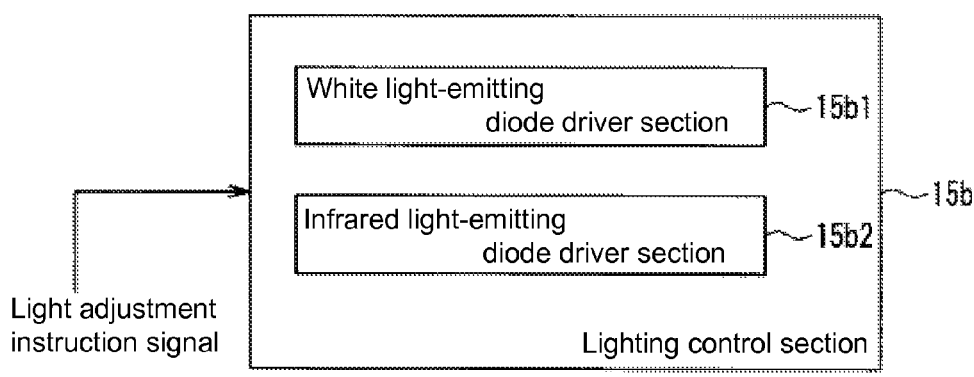
FIG. 8 is a block diagram specifically illustrating a configuration example of the lighting control section shown in FIG. 2.
Figure 9:
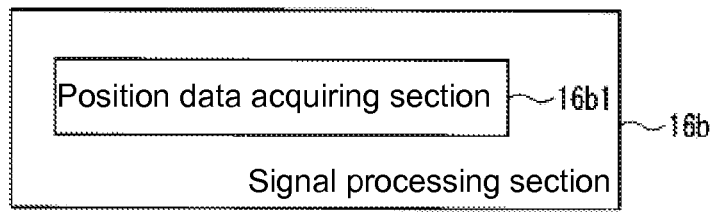
FIG. 9 is a block diagram specifically showing a configuration example of the signal processing section shown in FIG. 2.

FIG. 2 illustrates a configuration of main components of the aforementioned liquid crystal display device, and FIG. 3 is an enlarged cross-sectional view specifically illustrating a pixel configuration of the liquid crystal display device. FIG. 4 is an equivalent circuit diagram showing the configurations of the pixels and the optical sensors disposed on the liquid crystal display device, and FIG. 5 is a plan view showing the light guide plate and the linear light-emitting diode unit shown in FIG. 1. FIG. 6 is a perspective view specifically illustrating a configuration of the linear light-emitting diode unit, and FIG. 7 is a perspective view specifically illustrating a configuration of the main portion of the light guide plate. FIG. 8 is a block diagram illustrating a specific configuration example of the lighting control section shown in FIG. 2, and FIG. 9 is a block diagram showing a specific configuration example of the signal processing section shown in FIG. 2.

As shown in FIG. 2, in the liquid crystal display device 1 according to the present embodiment, the active matrix substrate 5 has a pixel region 17, a display gate driver 18, a display source driver 19, a sensor column driver 20, a sensor row driver 21, and a buffer amplifier 22 provided thereon. The display gate driver 18 and the display source driver 19 are connected to an LCD driver section 15 through an FPC (Flexible Printed Circuit), which is not shown. The sensor column driver 20, the sensor row driver 21, and the buffer amplifier 22 are connected to the touch panel driver section 16 through another FPC (not shown).

The aforementioned constituting members on the active matrix substrate 5 can also be formed monolithically by semiconductor processes on a transparent substrate, such as a glass substrate, which constitutes the active matrix substrate 5. Alternatively, drivers among the aforementioned constituting members may be mounted on the transparent substrate with the COG (Chip On Glass) technology or the like.

Alternatively, the same FPC may be used to connect the display gate driver 18 and the display source driver 19 to the LCD driver section 15 and to connect the sensor column driver 20, sensor row driver 21, and the buffer amplifier 22 to the touch panel driver section 16.

The pixel region 17 constitutes the display surface of the liquid crystal panel 2, and a plurality of pixels are disposed there in a matrix. In the pixel region 17, the above-mentioned optical sensors are provided on a pixel-by-pixel basis.

Specifically, in the liquid crystal panel 2, as shown in FIG. 3, on the color filter substrate 4, red (R), green (G), and blue (B) color filters 24r, 24g, and 24b are formed on the side facing the liquid crystal layer 23. Also in the liquid crystal panel 2, pixels Pr, Pg, and Pb, which are pixels corresponding to RGB colors, are provided for color filters 24r, 24g, and 24b, respectively.

On the other hand, on the active matrix substrate 5, switching elements, which are described below, are formed on a pixel-by-pixel basis. Also, on the active matrix substrate 5, the optical sensor 25 is disposed unitarily with the switching elements. As shown in FIG. 3, the light-receiving element of the optical sensor 25 is disposed inside the pixel Pr, Pg, or Pb, (in pixel Pr, for example). The light-receiving element is configured to receive the infrared light from outside the display surface. Also, the optical sensor 25 is configured to detect the infrared light contained in the illumination light.

The touch panel is configured such that the optical sensor 25 receives the infrared light reflected by an object (inspection object) such as a finger, and conducts a coordinate detection operation, in which the optical sensor 25 detects the coordinate (location) of the touch by a user. The touch panel then uses the result of the coordinate detection operation to conduct prescribed touch panel functions such as detection of the operational input instruction by the user (to be described in detail below).

In the pixel region 17, as shown in FIG. 4, a gate line Gn and source lines Srm, Sgm, and Sbm are disposed in a matrix, serving as wiring lines for pixels. The gate line Gn is connected to a display gate driver 18. The source lines Srm, Sgm, and Sbm are respectively provided for RGB colors, and are connected to a display source driver 19.

At the intersections of the gate line Gn and the source lines Srm, Sgm, and Sbm, thin film transistors (TFT) M1r, M1g, and M1b are respectively disposed as the switching elements for pixels. In the pixel Pr, the gate electrode of the thin film transistor M1r is connected to the gate line Gn, the source electrode is connected to the source line Srm, and the drain electrode is connected to the pixel electrode (not shown). Consequently, as shown in FIG. 4, in the pixel Pr, a liquid crystal capacitance LC is formed between the drain electrode of the thin film transistor M1r and the opposite electrode (VCOM). Also, an auxiliary capacitance LS is formed in parallel with the liquid crystal capacitance LC.

Likewise, in the pixel Pg, the gate electrode of the thin film transistor M1g is connected to the gate line Gn, the source electrode is connected to the source line Sgm, and the drain electrode is connected to the pixel electrode (not shown). Consequently, in the pixel Pg, as shown in FIG. 4, a liquid crystal capacitance LC is formed between the drain electrode of the thin film transistor M1g and the opposite electrode (VCOM). Also, an auxiliary capacitance LS is formed in parallel with the liquid crystal capacitance LC.

In pixel Pb, the gate electrode of the thin film transistor M1b is connected to the gate line Gn, the source electrode is connected to the source line Sbm, and the drain electrode is connected to the pixel electrode (not shown). Consequently, in the pixel Pb, as shown in FIG. 4, a liquid crystal capacitance LC is formed between the drain electrode of the thin film transistor M1b and the opposite electrode (VCOM). Also, an auxiliary capacitance LS is formed in parallel with the liquid crystal capacitance LC.

In the pixels Pr, Pg, and Pb, voltage signals (gradation voltages) representing the luminance (gradation) of the information to be displayed on the display surface are supplied from the display source driver 19 respectively through the source lines Srm, Sgm, and Sbm.

That is, as shown in FIG. 2, a panel control section 15a and a lighting control section 15b are provided in the LCD driver section 15. To the panel control section 15a, an image signal of the information to be displayed on the display surface is input from outside the liquid crystal display device 1. In the panel control section 15a, in response to the image signal input, instruction signals for the display gate driver 18 and for the display source driver 19 are generated and output to the respective drivers.

As a result, based on the instruction signals from the panel control section 15a, the display gate driver 18 sequentially outputs gate signals to the plurality of gate lines Gn, which are wired in a matrix, to turn on the gate electrodes of the corresponding thin film transistors M1r, M1g, and M1b. On the other hand, based on the instruction signals from the panel control section 15a, the display source driver 19 supplies the gradation voltages to the pixels Pr, Pg, and Pb through the source lines Srm, Sgm, and Sbm, respectively.

To the lighting control section 15b, a light adjustment instruction signal that calls for the change in the luminance of the illumination light is input from a controller or the like provided on the liquid crystal display device 1. The lighting control section 15b is configured to control the power supply to the linear light-emitting diode unit 9 of the lighting device 3 based on the light adjustment instruction signal.

Here, with reference to FIG. 5 to FIG. 7, the light-emitting diode unit 9 and the light guide plate 10 are specifically described.

As shown in FIG. 5 and FIG. 6, in the linear light-emitting diode unit 9 according to the present embodiment, a plurality (four, for example) of white light-emitting diodes 26 and a plurality (four, for example) of infrared light-emitting diodes 27 are unitarily disposed on the base member 28. Also, in the linear light-emitting diode unit 9, as shown in FIG. 5 and FIG. 6, white light-emitting diodes 26 and infrared light-emitting diodes 27 are arranged alternately and linearly on the base member 28.

White light-emitting diodes 26 constitute a first light-emitting diode section, which emits white light used for the information display on the liquid crystal panel 2. Also, a white light-emitting diode 26 includes a blue light-emitting element 26a that is disposed on the base member 28 and emits blue light, and a fluorescent resin element 26b that is disposed on the base member 28 to seal the blue light-emitting element 26a and converts a portion of the blue light into yellow light and mixes the blue light and the yellow light to emit the white light.

The electrode terminal of the blue light-emitting element 26a is electrically connected to the wiring provided on the base member 28 (not shown). The fluorescent resin element 26b includes a YAG-Ce fluorescent substance, for example, and the fluorescent resin element 26b constitutes a sealing resin element that seals the blue light-emitting element 26a serving as the light-emitting element. Specifically, as shown in FIG. 6, the fluorescent resin element 26b is configured into a half-circular columnar shape, protects the blue light-emitting element 26a that it seals, and improves the directionality of the white light to be projected outside.

The infrared light-emitting diode 27 constitutes a second light-emitting diode section that emits infrared light to be detected by the optical sensor 25. Also, the infrared light-emitting diode 27 includes an infrared light-emitting element 27a that is disposed on the base member 28 and emits infrared light having a wavelength (850 nm, for example) within a prescribed range (800 nm to 950 nm, for example) and a transparent resin element 27b that is disposed on the base member 28 to seal the infrared light-emitting element 27a.

As in the case with the blue light-emitting element 26a, the electrode terminal of the infrared light-emitting element 27a is electrically connected to the wiring disposed of the base member 28 (not shown). The transparent resin element 27b contains a silicon resin, for example, and the transparent resin element 27b constitutes a sealing resin element that seals the infrared light-emitting element 27a serving as the light-emitting element. Specifically, as shown in FIG. 6, the transparent resin element 27b is configured into a half-circular columnar shape, protects the infrared light-emitting element 27a that it seals, and improves the directionality of the infrared light to be projected outside.

Also, as shown in FIG. 5, the linear light-emitting diode unit 9 is coupled with the light entry surface 10a of the light guide plate 10 so as to be faced to each other. That is, as shown in FIG. 7, the light entry surface 10a of the light guide plate 10 is processed to create a rippled structure to form half-circular columnar recessed portions 10a1 which are shaped so that they touch the top portions of the half-circular columnar fluorescent resin elements 26b and the transparent resin elements 27b (sealing resin elements) and so that they are fitted to the half-circular columnar fluorescent resin elements 26b and half-circular columnar transparent resin elements 27b. Specifically, the light entry surface 10a has protrusions 10a2 that extend towards the linear light-emitting diode unit 9, and each of the protrusions 10a2 is positioned between a fluorescent resin element 26b and a neighboring transparent resin element 27b. The light entry surface 10a also has curved surfaces 10a3 formed between the adjacent protrusions 10a2. As a result, on the light entry surface 10a, recessed portions 10a1 are formed in the curved surfaces 10a3. Also, in the present embodiment, as shown in FIG. 5, the linear light-emitting diode unit 9 and the light entry surface 10a of the light guide plate 10 are coupled with each other in a fitted manner when eight recessed portions 10a1 are fitted to the fluorescent resin elements 26b and the transparent resin elements 27b.

Also, the light guide plate 10 has a light-emitting surface 10c that projects the light from the linear light-emitting diode unit 9 towards the liquid crystal panel 2. That is, the light entered through the light entry surface 10a is guided to prescribed propagation directions (right/left directions in FIG. 1) and then projected from the light-emitting surface 10c.

In the present embodiment, the distance that the fluorescent resin element 26b and the transparent resin element 27b extend into the recessed portion 10a1 is set to about ½ of the dimension of the fluorescent resin element 26b and the transparent resin element 27b. That is, the distance that the protrusions 10a2 extend towards the base member 28 in the up/down direction in FIG. 5 is set to about ½ of the dimension of the fluorescent resin element 26b or the transparent resin element 27b from the base member 28. Although a case in which the recessed portions 10a1 are provided by processing the light entry surface 10a to create a ripple structure is described above, the present embodiment is not limited to such. For example, injection molding may be used to form the recessed portions when the light guide plate is formed.

In the linear light-emitting diode unit 9, the blue light-emitting elements 26a and the infrared light-emitting elements 27a are mounted on the base member 28 with a prescribed interval P1 (FIG. 5) therebetween. Each of the blue light-emitting elements 26a and each of the infrared light-emitting elements 27a are, for the power supply, connected to a power supply circuit through the aforementioned wiring and FPC (not shown). Also, in the linear light-emitting diode unit 9, the white light-emitting diodes 26 and the infrared light-emitting diodes 27 are provided on the base member 28 unitarily such that the fluorescent resin elements 26b and the transparent resin elements 27b are disposed close to each other.

Further, in the linear light-emitting diode unit 9, the interval P2 between two adjacent blue light-emitting elements 26a is determined based on the distance to the effective light-emitting area A set on the light-emitting surface 10c of the light guide plate 10. Specifically, as indicated by the dotted line in FIG. 5, the light-emitting surface 10c of the light guide plate 10 has a predetermined effective light-emitting area A from which the light originated from the linear light-emitting diode unit 9 is substantially projected. Also, in the linear light-emitting diode unit 9, when the shortest distance from the contact point of the fluorescent resin element 26b and the light entry surface 10a to the effective light-emitting area A (that is, the distance in the direction parallel to the up/down direction of FIG. 5) is "L", interval P2 between two adjacent blue light-emitting elements 26a is determined based on L/P2. As a result, according to the present embodiment, uneven white light luminance (hot spot) in the effective light-emitting area A can be prevented from occurring.

In the linear light-emitting diode unit 9, on the top end surfaces and the bottom end surfaces of the half-circular columnar fluorescent resin element 26b and transparent resin element 26b, reflective sheets 12a and 12b are attached, respectively, to let the white light from the white light-emitting diode 26 and the infrared light from the infrared light-emitting diode 27 enter the light guide plate 10 while the lights are prevented from leaking out.

As described above, in the linear light-emitting diode unit 9, the white light-emitting diodes 26 and the infrared light-emitting diodes 27 coexist on the base member 28, and they are distributed evenly with respect to the display region (the display surface of the liquid crystal panel 2). Consequently, in the flat illumination light projected from the lighting device 3 to the liquid crystal panel 2, the in-plane luminance distribution can be made uniform for both the white light and the infrared light. If, for example, white light-emitting diodes 26 and infrared light-emitting diodes 27 are deposited on different base members, and the white light and the infrared light enter the light guide plate 10 through different sides of the light guide plate 10, it is difficult to make the in-plane luminance distributions even for both the white light and the infrared light. Also, if the in-plane luminance distribution of the infrared light is uneven, detection precision of the touch panel may be lowered.

In the linear light-emitting diode unit 9, the white light-emitting diodes 26 and the infrared light-emitting diodes 27 are, as described above, mounted on the base member 28 with a prescribed interval therebetween, and the blue light-emitting elements 26a and the infrared light-emitting elements 27a are provided unitarily on the base member 28 such that the resin elements are disposed close to each other. Consequently, in the linear light-emitting diode unit 9, compared to a case in which individually-configured white light-emitting diodes and the infrared light-emitting diodes are mounted on a flexible substrate (base member), it is easier to increase the number of white light-emitting diodes 26 and infrared light-emitting diodes 27, and to increase the white light luminance and the infrared light intensity.

Also, as shown in FIG. 8, in the lighting control section 15b, a white light-emitting diode driver section 15b1 that controls the driving of four white light-emitting diodes 26 and an infrared light-emitting diode driver section 15b2 that controls the driving of four infrared light-emitting diodes 27 are provided. The white light-emitting diode driver section 15b1 determines the power supply to the individual white light-emitting diodes 26 depending on the aforementioned light adjustment instruction signal to perform the lighting operation of the individual white light-emitting diodes 26. Also, the infrared light-emitting diode driver section 15b2 performs the lighting operation of the individual infrared light-emitting diodes 27 to provide infrared light of desired intensity.

Back to FIG. 4, the optical sensor 25 has a photodiode D1 serving as the light-receiving element, a capacitor C1, and thin film transistors M2 to M4. Also, in the optical sensor 25, a constant voltage is supplied from the sensor column driver 20 via wirings VSSj and VSDj disposed in parallel with the source lines Srm and Sbm, respectively. Also, the optical sensor 25 is configured to output the detection result to the sensor column pixel readout circuit 20a of the sensor column driver 20 via a wiring OUTj disposed in parallel with the source line Sgm.

Also, to the thin film transistor M4, a wiring RSTi is connected to supply the reset signal. To the thin film transistor M3, a wiring RWSi is connected to supply the readout signal. The wirings RSTi and RWSi are connected to the sensor row driver 21.

As shown in FIG. 2, the sensor column driver 20 includes a sensor column pixel readout circuit 20a, a sensor column amplifier 20b, and a sensor column scanning circuit 20c, and is configured to operate in response to the instruction signal from the optical sensor control section 16a of the touch panel driver section 16. To the sensor column pixel readout circuit 20a, detection results (voltage signals) obtained from the plurality of optical sensors 25, which are disposed in a matrix in the pixel region 17, are input sequentially through the wiring OUTj. The sensor column pixel readout circuit 20a then outputs the inputted voltage signals to the sensor column amplifier 20b.

The sensor column amplifier 20b includes a plurality of amplifiers (not shown) provided for the respective plurality of optical sensors 25, and the plurality of amplifiers amplify the corresponding voltage signals and output them to the buffer amplifier 22. The sensor column scanning circuit 20c outputs the column select signal to the sensor column amplifier 20b in response to the instruction signals from the optical sensor control section 16a, to sequentially connect the plurality of amplifiers of the sensor column amplifier 20b to the buffer amplifier 22. As a result, amplified voltage signals are output from the sensor column amplifier 20b to the touch panel driver section 16 through the buffer amplifier 22.

The sensor row driver 21 has a sensor row level shifter 21a using a shift register, and a sensor row scanning circuit 21b. The sensor row scanning circuit 21b sequentially selects the wirings RSTi and RWSi at prescribed time intervals in response to the instruction signals from the optical sensor control section 16a. As a result, in the pixel region 12, the optical sensors 25 from which the voltage signal (detection result) is to be read out are sequentially selected row by row in the matrix.

In the description above, the case in which one optical sensor 25 is provided for one group of RGB pixels Pr, Pg, and Pb in the pixel region 17 is discussed. However, the number of optical sensors 25 to be provided in the pixel region 17, the locations of constituting members such as the photodiode D1 included in the optical sensors 25, and the like are not limited to such, and can be determined flexibly. A photodiode (light-receiving element) D1 that performs substantial light detection may be disposed for each of the pixels Pr, Pg, and Pb to constitute an optical sensor 25 for each of the pixels, for example.

Also, as shown in FIG. 2, an optical sensor control section 16a and a signal processing section 16b are provided in the touch panel driver section 16. The touch panel driver section 16 controls the driving of the individual plurality of optical sensors 25, and, based on the detection results from the plurality of optical sensors 25, performs prescribed touch panel functions such as detection of the operational input instruction by a user touch operation.

The optical sensor control section 16a outputs the drive instruction signal to the sensor column driver 20 and the sensor row driver 21 when the power supply to the liquid crystal display device 1 is turned on, to make the optical sensor 25 conduct the sensing operation. That is, when the liquid crystal display device 1 is in operation, the optical sensor control section 16a instructs the optical sensor 25 to perform the coordinate detection operation to detect any touch operation by a user. The detection results of the optical sensor 25 are stored in the memory (not shown) provided in the touch panel driver section 16.

As shown in FIG. 9, a position data acquiring section 16b1 is provided in the signal processing section 16b, which is configured to perform prescribed touch panel functions including the detection of the operational input instruction by a user.

Specifically, the position data acquiring section 16b1 uses the detection results from the optical sensor 25 (i.e., coordinate detection operation results) stored in the above-mentioned memory to acquire data such as the position (coordinate) of a user finger placed on the display surface of the liquid crystal panel. That is, in the liquid crystal display device 1 according to the present embodiment, when a user performs a touch operation using a finger, for example, and places the finger at a desired location on the operational input display (instruction input display) of the liquid crystal panel 2, the infrared light projected from the liquid crystal panel 2 is reflected by the finger towards the liquid crystal panel 2, and this reflected infrared light is detected by the optical sensors 25 located approximately directly under the desired position. Then, the position data acquiring section 16b1 acquires the position data of the touch operation by the user on the instruction input display by using the detection results from the optical sensor 25 stored in the memory. Thus, the detection of the operational input instruction performed by a user is conducted in the liquid crystal display device 1 of the present embodiment.

Alternatively, the touch panel may be configured to conduct a scanner operation to acquire the image data.

The touch panel driver section 16, sensor column driver 20, sensor row driver 21, buffer amplifier 22, and optical sensor 25 are incorporated in the liquid crystal display device 1 of the present embodiment to constitute a touch panel that performs the prescribed touch panel functions.

In the linear light-emitting diode unit 9 of the lighting device 3 of the present embodiment configured as described above, blue light-emitting elements 26a and infrared light-emitting elements 27a are mounted on the base member 28 with a prescribed interval therebetween. Also, the blue light-emitting elements 26a and the infrared light-emitting elements 27a are sealed on the base member 28 by the half-circular columnar fluorescent resin elements 26b and transparent resin elements 27b (sealing resin elements), respectively. Also, the light entry surface 10a of the light guide plate 10 has half-circular columnar recessed portions 10a1 that are configured to touch the top portions of the half-circular columnar fluorescent resin elements 26b and transparent resin elements 27b, and to be fitted to the half-circular columnar fluorescent resin elements 26b and transparent resin elements 27b. Thus, in the lighting device 3 of the present embodiment, the linear light-emitting diode unit 9 and the light guide plate 10 are coupled with each other, with the fluorescent resin elements 26b and transparent resin elements 27b fitted to the recessed portions 10a1 of the light entry surface 10a. This configuration reliably improves the light use efficiency of the linear light-emitting diode unit 9 into which the light enters through the light entry surface 10a. Consequently, according to the present embodiment, unlike the conventional configurations described above, a high-luminance lighting device 3 that can improve the light use efficiency while allowing installation of increased number of light-emitting elements can be configured.

Also, in the present embodiment, a high-luminance lighting device 3 that can improve the light use efficiency while allowing the installation of increased number of light-emitting elements is used in the illuminating section. As a result, a high-performance liquid crystal display device 1 that can display information with a high luminance can easily be configured.

Also, in the linear light-emitting diode unit 9 of the lighting device 3 of the present embodiment, the white light-emitting diodes 26 and the red light-emitting diodes 27 are arranged alternately on the base member 28. Thus, in the lighting device 3 of the present embodiment, the luminance distribution of the white light and the infrared light in the illumination light can easily be made uniform. As a result, for the liquid crystal display device 1 of the present embodiment, the detection accuracy of the optical sensor 25 can be improved.

Embodiment 2

Figure 10:
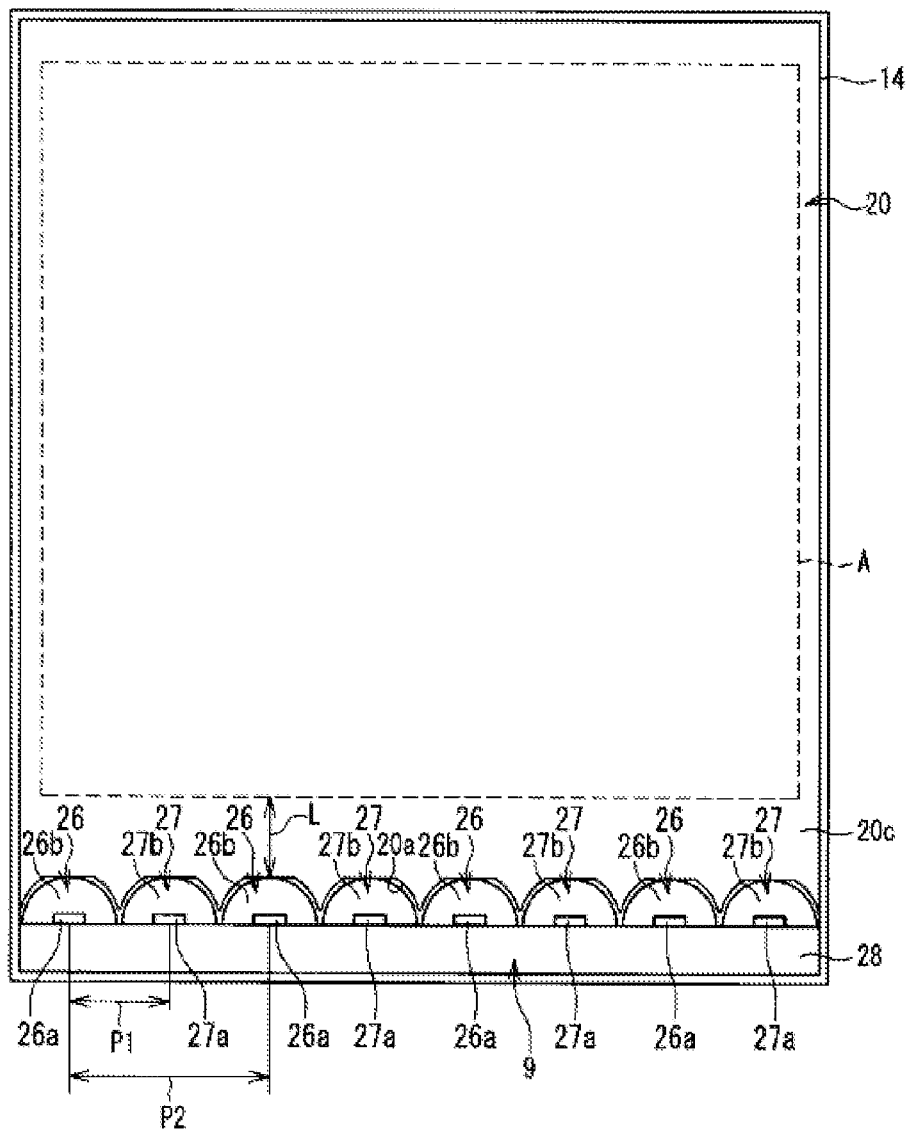
FIG. 10 is a plan view showing a light guide plate and a linear light-emitting diode unit of a liquid crystal display device according to Embodiment 2 of the present invention.
Figure 11:
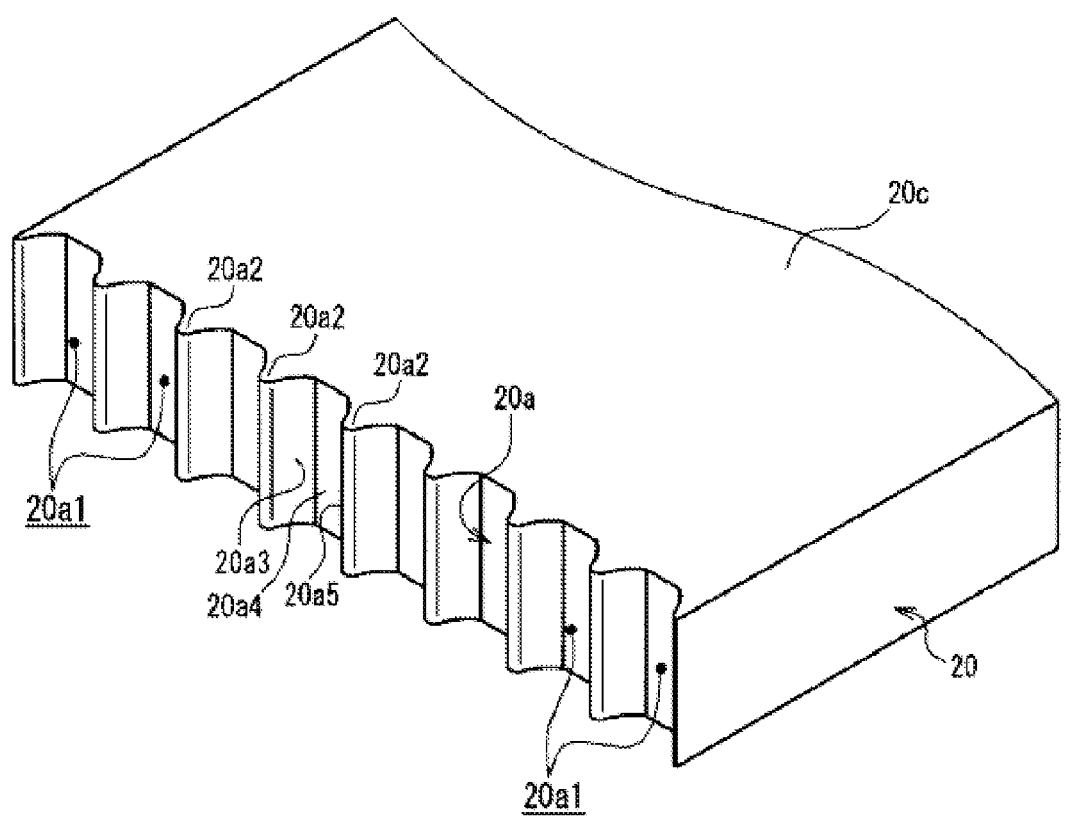
FIG. 11 is a perspective view specifically showing a configuration of main components of the light guide plate shown in FIG. 8.

FIG. 10 is a plan view showing a light guide plate and a linear light-emitting diode unit of a liquid crystal display device according to Embodiment 2 of the present invention. FIG. 11 is a perspective view specifically showing a configuration of main components of the light guide plate shown in FIG. 10. As shown in the figures, the main difference between the present embodiment and Embodiment 1 described above is that, in the present embodiment, the light entry surface of the light guide plate has flat surfaces for touching the top portions of the fluorescent resin elements and transparent resin elements, and also has approximately half-circular columnar recessed portions to be fitted to the fluorescent resin elements and transparent resin elements. For elements in common with Embodiment 1 described above, same reference characters are used, and redundant descriptions are omitted.

That is, as shown in FIG. 10 and FIG. 11, in the lighting device 3 of the present embodiment, the light entry surface 20a of the light guide plate 20 is processed to form a rippled structure, and approximately half-circular columnar recessed portions 20a1 are formed. Specifically, as shown in FIG. 11, the light entry surface 20a has protrusions 20a2 that are formed to be fitted between the adjacent fluorescent resin elements 26b and transparent resin elements 27b and that extend towards the linear light-emitting diode unit 9. The light entry surface 20a also has curved surfaces 20a3, flat surfaces 20a4, and curved surfaces 20a5, which are interposed between two adjacent protrusions 20a2. The curved surface 20a3, flat surface 20a4, and curved surface 20a5 are continuously formed. On the light entry surface 20a, recessed portions 20a1 are formed, and each of them are surrounded by a curved surface 20a3, a flat surface 20a4, and a curved surface 20a5.

Also, in the present embodiment, as shown in FIG. 10, the linear light-emitting diode unit 9 and the light entry surface 20a of the light guide plate 20 are coupled unitarily with each other, with eight recessed portions 20a1 and the fluorescent resin elements 26b and the transparent resin elements 27b fitted together. Also, the flat surfaces 20a4 are configured to touch the top portions of the fluorescent resin elements 26b or the top portions of the transparent resin elements 27b when the linear light-emitting diode unit 9 and the light entry surface 20a of the light guide plate 20 are fitted together as a unit.

In the present embodiment, the distance that the fluorescent resin element 26b and the transparent resin element 27b extend into the recessed portion 20a1 is set to about ½ of the dimension of the fluorescent resin element 26b and the transparent resin element 27b. That is, the distance that the protrusions 20a2 extend towards the base member 28 in the up/down direction in FIG. 10 is set to about ½ of the dimension of the fluorescent resin 26b and the transparent resin element 27b from the base member 28. Although the case in which the recessed portions 20a1 are provided by processing the light entry surface 20a to form a rippled structure is described above, the present embodiment is not limited to such. For example, injection molding may be used to form the recessed portions when the light guide plate is formed.

With the configuration described above, similar operations and effects as Embodiment 1 can be obtained according to the present embodiment. Also, in the lighting device 3 of the present embodiment, the linear light-emitting diode unit 9 and the light guide plate 20 are coupled with each other, with the fluorescent resin elements 26b and the transparent resin elements 27b (sealing resin elements) fitted to the approximately half-circular columnar recessed portions 20a1. This configuration reliably improves the light use efficiency of the linear light-emitting diode unit 9 which projects the light to the light entry surface 20a. Also, in the lighting device 3 of the present embodiment, the light entry surface 20a has flat surfaces 20a4, which are configured to touch the top portions of the fluorescent resin elements 26b or the transparent resin elements 27b. As a result, even if a misalignment occurs when the linear light-emitting diode unit 9 and the light guide plate 20 are coupled to each other, the flat surfaces 20a4 can absorb the misalignment. This configuration, therefore, readily simplifies the process of coupling the linear light-emitting diode unit 9 and the light guide plate 20 to each other.

Embodiment 3

Figure 12:
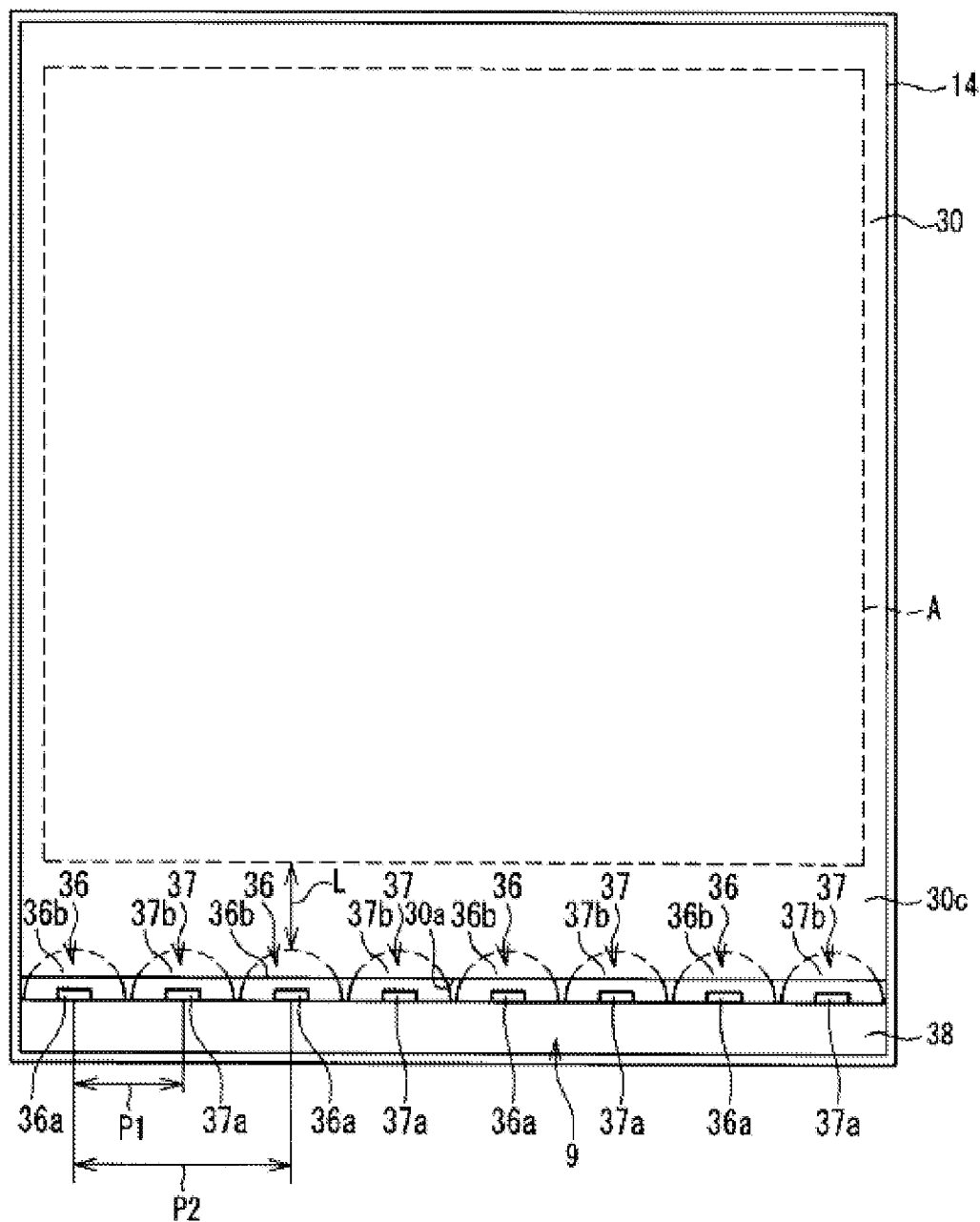
FIG. 12 is a plan view showing a light guide plate and a linear light-emitting diode unit of a liquid crystal display device according to Embodiment 3 of the present invention.
Figure 13:
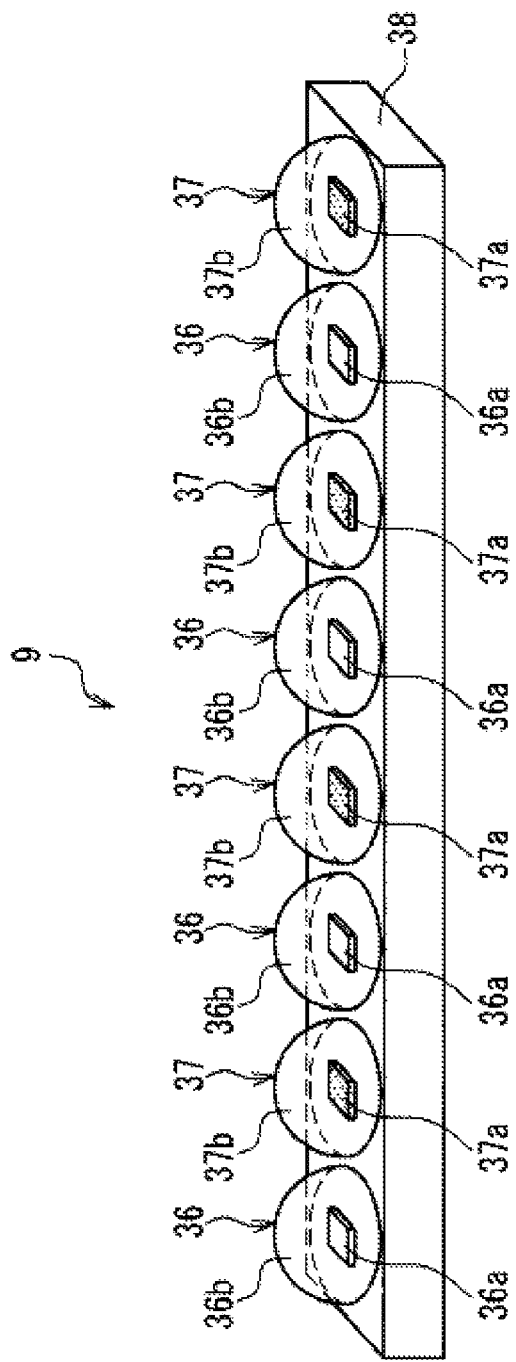
FIG. 13 is a perspective view specifically showing a configuration of the linear light-emitting diode unit shown in FIG. 12.
Figure 14:
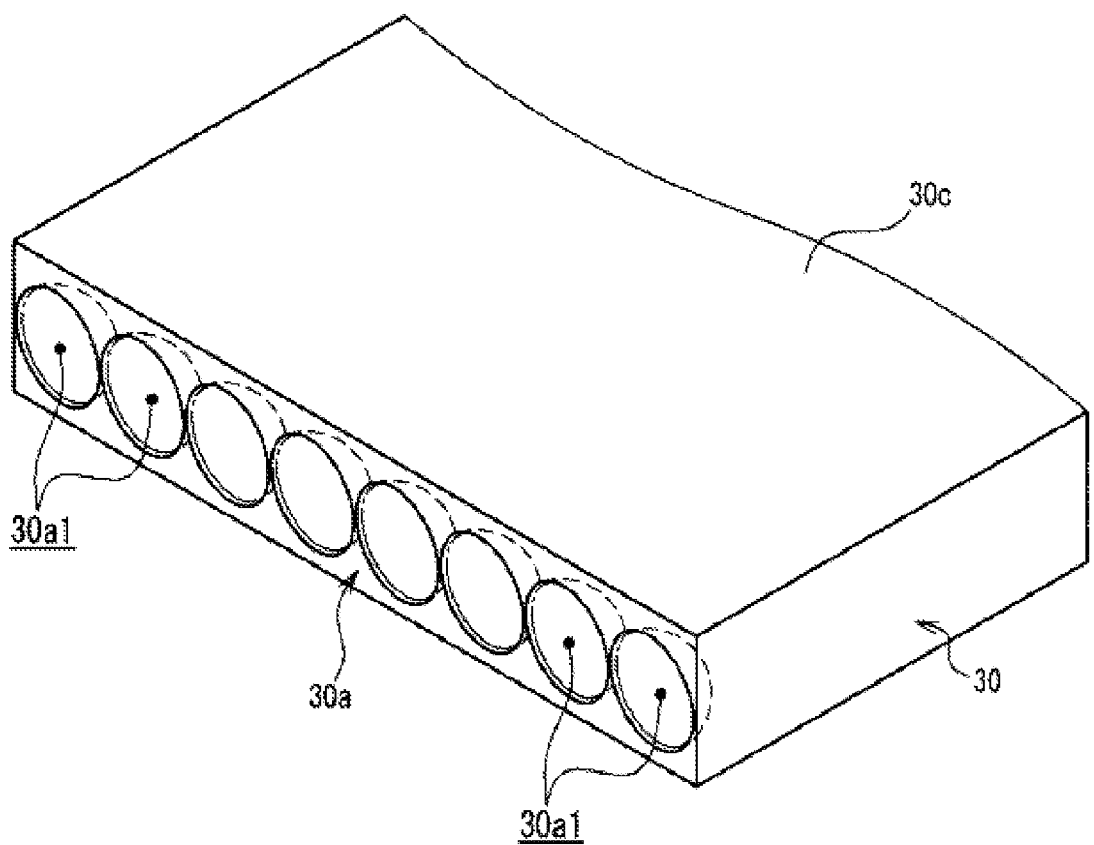
FIG. 14 is a perspective view specifically showing a configuration of main components of the light guide plate shown in FIG. 12.

FIG. 12 is a plan view showing a light guide plate and a linear light-emitting diode unit of a liquid crystal display device according to Embodiment 3 of the present invention. FIG. 13 is a perspective view specifically showing a configuration of the linear light-emitting diode unit shown in FIG. 12, and FIG. 14 is a perspective view specifically showing a configuration of main components of the light guide plate shown in FIG. 12. As shown in the figures, the main difference between the present embodiment and Embodiment 1 is that in the present embodiment, the fluorescent resin elements and the transparent resin elements are formed into a hemispherical shape on the base member, and hemispherical recessed portions configured to be fitted to the fluorescent resin elements and the transparent resin elements are formed in the light entry surface of the light guide plate. For elements in common with Embodiment 1 described above, same reference characters are used, and redundant descriptions are omitted.

That is, as shown in FIG. 12 to FIG. 14, in the linear light-emitting diode unit 9 of the present embodiment, four white light-emitting diodes 36 and four infrared light-emitting diodes 37 are unitarily formed on the base member 38, and the white light-emitting diodes 36 and the infrared light-emitting diodes 37 are arranged alternately and linearly on the base member 38.

As in the case with Embodiment 1 and Embodiment 2, the white light-emitting diodes 36 constitute a first light-emitting diode section that emits white light to be used for the information display on the liquid crystal panel 2. Also, the white light-emitting diode 36 includes a blue light-emitting element 36a that is disposed on the base member 38 and emits blue light, and a fluorescent resin element 36b that is disposed on the base member 38 to seal the blue light-emitting element 36a and converts a portion of the blue light into yellow light and mixes the blue light and the yellow light to emit the white light.

The electrode terminal of the blue light-emitting element 36a is electrically connected to the wiring provided on the base member 38 (not shown). The fluorescent resin element 36b contains YAG-Ce fluorescent substance, for example, and the fluorescent resin element 36b constitutes a sealing resin element that seals the blue light-emitting element 36a, which serves as the light-emitting element. Specifically, as shown in FIG. 13, the fluorescent resin element 36b is configured into a hemispherical shape, protects the blue light-emitting element 36a that it seals off, and improves the directionality of the white light to be projected outside.

As in the case with Embodiment 1 and Embodiment 2, the infrared light-emitting diodes 37 constitute a second light-emitting diode section that emits infrared light to be detected by the optical sensor 25. Also, the infrared light-emitting diode 37 includes an infrared light-emitting element 37a that is disposed on the base member 38 and emits infrared light having a wavelength (850 nm, for example) within a prescribed range (800 nm to 950 nm, for example), and a transparent resin element 37b that is disposed on the base member 38 to seal the infrared light-emitting element 37a.

As in the case with the blue light-emitting element 36a, the electrode terminal of the infrared light-emitting element 37a is electrically connected to the wiring provided on the base member 38 (not shown). The transparent resin element 37b contains a silicon resin, for example, and the transparent resin element 37b constitutes a sealing resin element that seals the infrared light-emitting element 37a, which serves as the light-emitting element. Specifically, as shown in FIG. 13, the transparent resin element 37b is configured into a hemispherical shape, protects the infrared light-emitting element 37a that it seals, and improves the directionality of the infrared light to be projected outside.

Also, as shown in FIG. 12, the linear light-emitting diode unit 9 is unitarily coupled with the light entry surface 30a of the light guide plate 30. That is, as shown in FIG. 14, the light entry surface 30a of the light guide plate 30 is processed to create a cut out structure to provide hemispherical recessed portions 30a1 formed to touch the top portions of the hemispherical fluorescent resin elements 36b and transparent resin elements 37b (sealing resin elements), and to be fitted to the hemispherical fluorescent resin elements 36b and transparent resin elements 37b. Additionally, in the present embodiment, as shown in FIG. 12, the linear light-emitting diode unit 9 and the light entry surface 30a of the light guide plate 30 are coupled with each other, with eight recessed portions 30a1 fitted to the fluorescent resin elements 36b and the transparent resin elements 37b.

Also, as in the case with the light guide plates in Embodiment 1 and Embodiment 2, the light guide plate 30 has a light-emitting surface 30c that projects the light originated from the linear light-emitting diode unit 9 towards the liquid crystal panel 2. That is, the light transmitted through the light entry surface 30a is guided to prescribed propagation directions (right/left directions in FIG. 1) and then projected from the light-emitting surface 30c.

In the present embodiment, the distance that the fluorescent resin element 36b and the transparent resin element 37b extend into the recessed portion 30a1 is set to about ½ of the dimension of the fluorescent resin element 36b and the transparent resin element 37b. That is, the distance that the recessed portion 30a1 is cut out into in the up/down direction in FIG. 12 from the light entry surface 30a is set to about ½ of the dimension of the fluorescent resin element 36b and the transparent resin element 37b from the base member 38. Although a case in which recessed portions 30a1 are formed by processing the light entry surface 30a to create cut out structure is described above, the present embodiment is not limited to such. For example, injection molding may be used to form the recessed portions when the light guide plate is formed.

In the linear light-emitting diode unit 9, the blue light-emitting elements 36a and the infrared light-emitting elements 37a are mounted on the base member 38 with a prescribed interval P1 (FIG. 12) between each other. Each of the blue light-emitting elements 36a and each of the infrared light-emitting elements 37a are connected to a power supply circuit through the aforementioned wiring and FPC for power supply (not shown). Also, in the linear light-emitting diode unit 9, the white light-emitting diodes 36 and the infrared light-emitting diodes 37 are provided on the base member 38 unitarily so that the fluorescent resin elements 36b and the transparent resin elements 37b are disposed close to each other.

Further, as in the case with Embodiment 1 and Embodiment 2, in the linear light-emitting diode unit 9, the interval "P2" between two adjacent blue light-emitting elements 36a is set based on the distance to the effective light-emitting area A set on the light-emitting surface 30c of the light guide plate 30. Specifically, as indicated by the dotted line in FIG. 12, the light-emitting surface 30c of the light guide plate 30 has a predetermined effective light-emitting area A from which the light originated from the linear light-emitting diode unit 9 is substantially projected. Also, in the linear light-emitting diode unit 9, when the shortest distance from the contact point of the fluorescent resin 36b and the light entry surface 30a to the effective light-emitting area A (that is, the distance in the direction parallel to the up/down direction of FIG. 12) is "L", interval "P2" between adjacent two blue light-emitting elements 36a is determined based on L/P2. As a result, according to the present embodiment, uneven white light luminance (hot spot) in the effective light-emitting area A can be prevented from occurring.

With the configuration described above, similar operations and effects as Embodiment 1 can be obtained according to the present embodiment. Also, in the lighting device 3 of the present embodiment, the linear light-emitting diode unit 9 and the light guide plate 30 are coupled with each other, with the fluorescent resin elements 36b and the transparent resin elements 37b (sealing resin) fitted to the hemispherical recessed portions 30a1. This configuration reliably improves the light use efficiency of the linear light-emitting diode unit 9 which projects the light to the light entry surface 30a. Also, in the lighting device 3 of the present embodiment, because the hemispherical recessed portions 30a1 and the hemispherical fluorescent resin elements 36b and transparent resin elements 37b are fitted together, the amount of the white light and the infrared light entering into the light guide plate 30 can easily be increased.

All the embodiments described above are mere examples and are not limiting in any way. The technological scope of the present invention is defined by the appended claims, and all changes that come within the range of equivalency of the claims are intended to be embraced therein.

For example, although cases in which the present invention is applied to a transmissive liquid crystal display device are described above, the lighting device of the present invention is not limited to such. The lighting device of the present invention may be applied to a wide variety of display devices equipped with non-light-emitting display section that displays information such as images and characters using the light from a light source. Specifically, a lighting device of the present invention may suitably be used for semi-transmissive liquid crystal display devices or projection type display devices in which a liquid crystal panel is used as the light valve.

Also, described above are the cases in which fluorescent resin elements and transparent resin elements (sealing resin elements) are formed into a half-circular columnar shape or a hemispherical shape on the base member, and recessed portions are formed in the light entry surface of the light guide plate into a half-circular columnar, approximately half-circular columnar, or hemispherical shape such that the recessed portions touch the top portions of the sealing resin elements and are fitted to the sealing resin elements. However, a lighting device of the present invention is not limited to such. A lighting device of the present invention only needs to have: a light-emitting diode unit that includes a base member, a plurality of light-emitting elements linearly disposed on the base member with a prescribed interval therebetween, and sealing resin elements that are formed into a prescribed shape and are provided for respective light-emitting elements to seal the respective light-emitting elements on the base member; and a light guide plate having a light entry surface formed to be fitted to the plurality of sealing resin elements provided for the respective light-emitting elements.

In the description above, configurations in which a light guide plate having a rectangular cross section is used and one side of the light guide plate is used as the light entry surface and the linear light-emitting diode unit (light-emitting diode unit) is disposed facing the light entry surface were discussed. However, the present invention is not limited to such. A light guide plate having a wedge-shaped cross section may be used, and a plurality of light-emitting diode units may be disposed facing multiple sides of the light guide plate having multiple light entry surfaces.

Also, in the description above, cases were discussed in which white light-emitting diodes (first light-emitting diode section) use blue light-emitting elements that emit blue light, and use fluorescent resin elements that are disposed on the base member, that seal the respective blue light-emitting elements, and that emit white light by converting a portion of the blue light into yellow light and mixing the blue light and the yellow light. However, the first light-emitting diode section of the present invention only needs to emit white light, and is not limited in any other way. Specifically, for example, light-emitting diodes that can be used may include light-emitting elements emitting a first color light other than blue light, such as ultraviolet light, and fluorescent resin elements which convert a portion of the first color light from the light-emitting elements into a second color light, which is a complementary of the first color light, and emit white light by mixing the first color light and the second color light. So-called "3-in-1" light-emitting diodes, in which RBG light-emitting diodes that individually emit red (R), green (G), or blue (B) light are provided unitarily, may also be used.

However, it is preferable to use blue light-emitting elements that emit blue light as in the embodiments described above, because the lighting device with the blue light-emitting elements can be constructed at a lower cost. The blue light-emitting element is also preferable because it has higher luminance, longer service life, and higher reliability compared to other light-emitting elements. Therefore it can easily constitute a high-performance lighting device.

Also, in the description above, cases were discussed in which infrared light-emitting diodes (second light-emitting diode section) that emit infrared light are provided in the linear light-emitting diode unit (light-emitting diode unit), and a touch panel equipped with optical sensors that detect infrared light are provided on the liquid crystal panel (display section). However, a display device of the present invention is not limited to such. In a display device of the present invention, the optical sensor may be installed without any infrared light-emitting diodes, or a touch panel may be omitted.

However, it is preferable to provide a touch panel equipped with optical sensors that detect infrared light, like the embodiments described above, because this configuration constitutes a display device including a touch panel, which allows detection of the operational input instruction given by a user. With the optical sensors, regardless of the contents of display on the liquid crystal panel (display section), detection precision of the touch panel can be improved, which is preferable. Further, infrared light-emitting diodes are preferably disposed on the side of the lighting device, because that way, the detection precision of the optical sensor and the touch panel can easily be improved.

Also, in the description above, cases are discussed in which optical sensors are unitarily provided on the active matrix substrate of the liquid crystal panel (display section). However, optical sensors to be used are not limited to such. Optical sensors separately provided on the active matrix substrate may also be used.

However, as in the case with embodiments described above, optical sensors unitarily provided on the active matrix substrate are preferably used, because such optical sensors can readily constitute a display device equipped with a compact touch panel.

Another possible configuration, besides those described above, is that optical sensors (light-receiving elements) that receive white light (visible light) are unitarily provided on the active matrix substrate on a pixel-by-pixel basis, and the touch panel driver section uses detection results from two optical sensors, i.e., an optical sensor that detects the infrared light and another optical sensor that detects the white light, to perform certain touch panel functions such as detection of an operational input instruction by a user. Yet another possible configuration is that an illuminance sensor that detects external light such as sunlight is provided so that the touch panel driver section can perform the certain touch panel functions.

INDUSTRIAL APPLICABILITY

The present invention is useful for a high-luminance lighting device that can improve the light use efficiency while allowing installation of increased number of light-emitting elements, and is also useful for a display device using such a lighting device.

DESCRIPTION OF REFERENCE CHARACTERS 1 liquid crystal display device (display device)
2 liquid crystal panel (display section)
3 lighting device (illuminating section)
5 active matrix substrate
9 linear light-emitting diode unit (light-emitting diode unit)
10, 20, 30 light guide plate
10a, 20a, 30a light entry surface
10c, 20c, 30c light-emitting surface
10a1 (half-circular columnar) recessed portion
20a1 (approximately half-circular columnar) recessed portion
20a4 flat surface
30a1 (hemispherical) recessed portion
16 touch panel driver section (touch panel)
20 sensor column driver (touch panel)
21 sensor row driver (touch panel)
22 buffer amplifier (touch panel)
25 optical sensor (touch panel)
26, 36 white light-emitting diode (first light-emitting diode section)
26a, 36a blue light-emitting element (first light-emitting diode section, light-emitting element)
26b, 36b fluorescent resin element (first light-emitting diode section, sealing resin element)
27, 37 infrared light-emitting diode (second light-emitting diode section)
27a, 37a infrared light-emitting element (second light-emitting diode section, light-emitting element)
27b, 37b transparent resin element (second light-emitting diode section, sealing resin element)
28 base member
A effective light-emitting area

The invention claimed is:

1. A lighting device, comprising:
a light-emitting diode unit having a plurality of light-emitting diodes; and
a light guide plate having a light entry surface through which light originating from said light-emitting diode unit enters, and a light-emitting surface from which the light that has entered through said light entry surface is emitted, said light guide plate further guiding the light that has entered through said light entry surface to prescribed propagation directions so that the light is projected from said light-emitting surface,
wherein said light-emitting diode unit comprises:
a base member;
a plurality of light-emitting elements arranged linearly on said base member with a prescribed interval therebetween; and
sealing resin elements formed into a prescribed shape and respectively provided for said light-emitting elements to seal corresponding light-emitting elements on said base member,
wherein said light entry surface is shaped on said light guide plate such that said light entry surface engages with said sealing resin elements respectively provided for said light-emitting elements, and
wherein in said light-emitting diode unit, a first light-emitting diode section that can emit white light and a second light-emitting diode section that can emit infrared light are disposed alternately and laterally on said base member.

2. The lighting device according to claim 1, wherein in said light-emitting diode unit, said plurality of sealing resin elements are individually formed into a half-circular columnar shape on said base member, and
wherein half-circular columnar recessed portions are formed in said light entry surface of said light guide plate to touch top portions of said half-circular columnar sealing resin elements, and also to be fitted to said half-circular columnar sealing resin elements.

3. The lighting device according to claim 1, wherein in said light-emitting diode unit, each of said plurality of sealing resin elements is formed into a half-circular columnar shape on said base member, and
wherein said light entry surface of said light guide plate has approximately half-circular columnar recessed portions that include flat surfaces formed to touch the top portions of said half-circular columnar sealing resin elements and that are also formed to be fitted to said half-circular columnar sealing resin elements.

4. The lighting device according to claim 1, wherein in said light-emitting diode unit, each of said plurality of sealing resin elements is formed into a hemispherical shape on said base member, and
wherein said light entry surface of said light guide plate has hemispherical recessed portions formed to touch the top portions of said hemispherical sealing resin elements, and also to be fitted to said hemispherical sealing resin elements.

5. The lighting device according to claim 1, wherein said first light-emitting diode section includes a blue light-emitting element that emits blue light as said light-emitting element, and a fluorescent resin element provided on said base member as said sealing resin element to seal said blue light-emitting element, and to emit said white light by converting a portion of said blue light into yellow light and by mixing said blue light and said yellow light, and wherein said second light-emitting diode section includes an infrared light-emitting element that emits said infrared light as said light-emitting element; and a transparent resin element provided on said base member as said sealing resin element to seal said infrared light-emitting element.

6. The lighting device according to claim 5, wherein the light-emitting surface of said light guide plate has a predetermined effective light-emitting area that substantially emits the light originating from said light-emitting diode unit, and
wherein in said light-emitting diode unit, when the shortest distance from the contact point of said fluorescent resin element and said light entry surface to said effective light-emitting area is denoted as "L", an interval "P2" between two adjacent blue light-emitting elements is determined based on L/P2.

7. A display device comprising a display section having a plurality of pixels, and an illuminating section that projects illumination light to said display section, wherein said illuminating section includes the lighting device according to claim 1.

8. The display device according to claim 7, wherein said display section includes a touch panel equipped with optical sensors that are disposed on a pixel-by-pixel basis to detect infrared light.

9. The display device according to claim 8, wherein a liquid crystal panel is used for said display section, and
wherein said optical sensors are unitarily disposed on an active matrix substrate of said liquid crystal panel.

10. A lighting device, comprising:
a light-emitting diode unit having a plurality of light-emitting diodes; and
a light guide plate having a light entry surface through which light originating from said light-emitting diode unit enters, and a light-emitting surface from which the light that has entered through said light entry surface is emitted, said light guide plate further guiding the light that has entered through said light entry surface to prescribed propagation directions so that the light is projected from said light-emitting surface,
wherein said light-emitting diode unit comprises:
a base member;
a plurality of light-emitting elements arranged linearly on said base member with a prescribed interval therebetween; and
sealing resin elements having a prescribed height, respectively provided for said light-emitting elements to seal corresponding light-emitting elements on said base member,
wherein said light entry surface has recessed portions having a prescribed depth to engage with said sealing resin elements respectively provided for said light-emitting elements, and
wherein the depth of said recessed portions is about one half of the height of the sealing resin elements.

11. The lighting device according to claim 10, wherein in said light-emitting diode unit, said plurality of sealing resin elements are individually formed into a half-circular columnar shape on said base member, and
wherein half-circular columnar recessed portions are formed in said light entry surface of said light guide plate to touch top portions of said half-circular columnar sealing resin elements, and also to be fitted to said half-circular columnar sealing resin elements.

12. The lighting device according to claim 10, wherein in said light-emitting diode unit, each of said plurality of sealing resin elements is formed into a half-circular columnar shape on said base member, and
wherein said light entry surface of said light guide plate has approximately half-circular columnar recessed portions that include flat surfaces formed to touch the top portions of said half-circular columnar sealing resin elements and that are also formed to be fitted to said half-circular columnar sealing resin elements.

13. The lighting device according to claim 10, wherein in said light-emitting diode unit, each of said plurality of sealing resin elements is formed into a hemispherical shape on said base member, and
wherein said light entry surface of said light guide plate has hemispherical recessed portions formed to touch the top portions of said hemispherical sealing resin elements, and also to be fitted to said hemispherical sealing resin elements.

14. The lighting device according to claim 10, wherein in said light-emitting diode unit, a first light-emitting diode section that can emit white light and a second light-emitting diode section that can emit infrared light are disposed alternately and laterally on said base member.

15. The lighting device according to claim 14, wherein said first light-emitting diode section includes a blue light-emitting element that emits blue light as said light-emitting element, and a fluorescent resin element provided on said base member as said sealing resin element to seal said blue light-emitting element, and to emit said white light by converting a portion of said blue light into yellow light and by mixing said blue light and said yellow light, and
wherein said second light-emitting diode section includes an infrared light-emitting element that emits said infrared light as said light-emitting element; and a transparent resin element provided on said base member as said sealing resin element to seal said infrared light-emitting element.

16. The lighting device according to claim 15, wherein the light-emitting surface of said light guide plate has a predetermined effective light-emitting area that substantially emits the light originating from said light-emitting diode unit, and
wherein in said light-emitting diode unit, when the shortest distance from the contact point of said fluorescent resin element and said light entry surface to said effective light-emitting area is denoted as "L", an interval "P2" between two adjacent blue light-emitting elements is determined based on L/P2.

17. A display device comprising a display section having a plurality of pixels, and an illuminating section that projects illumination light to said display section, wherein said illuminating section includes the lighting device according to claim 10.

18. The display device according to claim 16, wherein said display section includes a touch panel equipped with optical sensors that are disposed on a pixel-by-pixel basis to detect infrared light.

19. The display device according to claim 17, wherein a liquid crystal panel is used for said display section, and
wherein said optical sensors are unitarily disposed on an active matrix substrate of said liquid crystal panel.

* * * * *